US008049524B2

(12) United States Patent
Gehrke et al.

(10) Patent No.: US 8,049,524 B2
(45) Date of Patent: Nov. 1, 2011

(54) METHOD FOR DETECTING COMPONENT DEFECTS OF AN ANALOG SIGNAL PROCESSING CIRCUIT, ESPECIALLY FOR A MEASUREMENT TRANSMITTER

(75) Inventors: Martin Gehrke, Weinstadt (DE); Friedrich Füβ, Tübingen (DE)

(73) Assignee: Endress + Hauser Conducta Gesellschaft für Mess-und Regeltechnik mbH + Co. KG, Gerligen (DE)

( * ) Notice: Subject to any disclaimer, the term of this patent is extended or adjusted under 35 U.S.C. 154(b) by 351 days.

(21) Appl. No.: 11/922,457

(22) PCT Filed: Jun. 8, 2006
(Under 37 CFR 1.47)

(86) PCT No.: PCT/EP2006/062992
§ 371 (c)(1),
(2), (4) Date: Sep. 15, 2009

(87) PCT Pub. No.: WO2006/136497
PCT Pub. Date: Dec. 28, 2006

(65) Prior Publication Data
US 2011/0109334 A1      May 12, 2011

(30) Foreign Application Priority Data
Jun. 23, 2005   (DE) .......................... 10 2005 029 615

(51) Int. Cl.
*G01R 31/00*      (2006.01)

(52) U.S. Cl. .................. 324/750.01; 324/500; 324/523; 714/719; 714/724

(58) Field of Classification Search .................. None
See application file for complete search history.

(56) References Cited

U.S. PATENT DOCUMENTS

| 3,643,156 | A |   | 2/1972 | Stewart |
| 4,458,196 | A |   | 7/1984 | Goyal |
| 4,893,072 | A |   | 1/1990 | Matsumoto |
| 5,315,257 | A |   | 5/1994 | Guillard |
| 5,491,632 | A | * | 2/1996 | Pawlak et al. ..................... 701/1 |
| 6,037,578 | A |   | 3/2000 | Grandjean |
| 6,232,834 | B1 |  | 5/2001 | Zheng |
| 7,154,275 | B2 | * | 12/2006 | Zank et al. .................... 324/457 |
| 2004/0021471 | A1 | | 2/2004 | Ngo |
| 2004/0194532 | A1 | | 10/2004 | Lally |

FOREIGN PATENT DOCUMENTS

| DE | 102 31 180 A1 | 10/2003 |
| GB | 967555 | 8/1964 |
| WO | WO 2004/086069 | 10/2004 |

* cited by examiner

*Primary Examiner* — Huy Q Phan
*Assistant Examiner* — Trung Nguyen
(74) *Attorney, Agent, or Firm* — Bacon & Thomas, PLLC

(57) ABSTRACT

A method for detecting component defects of an analog signal processing circuit, especially for a measurement transmitter. A test signal TS is generated at a first test point TP1 and an associated response signal RS tapped at a second test point TP2 and evaluated in a digital unit. In the evaluation, individual amplitude values of the response signal RS are compared with predetermined, desired values. In the case of significant deviations, a defect report is generated.

5 Claims, 4 Drawing Sheets

METHOD FOR DETECTING COMPONENT DEFECTS OF AN ANALOG SIGNAL PROCESSING CIRCUIT, ESPECIALLY FOR A MEASUREMENT TRANSMITTER

TECHNICAL FIELD

The invention relates to a method for detecting component defects of an analog signal processing circuit, especially for a measurement transmitter.

BACKGROUND DISCUSSION

In process automation technology, sensors are used in a multitude of applications for registering various measured variables. The signals of the sensors are fed to measurement transmitters, where they are suitably conditioned and displayed or forwarded via a fieldbus to a superordinated unit. Examples which can be named include pressure and temperature transmitters, pH/redox-potential measurement transmitters, conductivity transmitters, etc., for the corresponding measured variables, pressure, temperature, pH-value and conductivity value, respectively.

The task of a sensor is to convert the physical/chemical, measured variable into an electrical signal. In the measurement transmitter, a first conditioning of the analog, electrical signal occurs. Then, such is converted into a digital signal, which is fed to a microcontroller, in which the actual signal processing takes place.

The circuit needed for the analog signal conditioning comprises, as a rule, a circuit board with a plurality of analog components. In the manufacture of such a signal conditioning circuit, populating errors are not out of the question. Here, one distinguishes, in principle, two cases. First, the pertinent component is wrong. I.e., the wrong component was used in the populating. Second, the pertinent component is missing. I.e., the component was forgotten in the populating.

Both defect possibilities have, as a rule, a significant effect on quality of the signal processing and on measurement result.

An opportunity for preventing such populating errors is to perform a test, e.g. an ICT (in-circuit test), following the populating of the circuit board. For this, appropriate test points must be provided on the circuit board.

By applying defined alternating voltage signals and tapping resulting signals at individual test points, an analog signature analysis (ASA) can be performed. In the case of known impedance of the components, or component groups, defective components can be detected from the current-voltage characteristic, which is referred to as the "impedance signature".

Due to ever-increasing component density on circuit boards, suitable test points are frequently no longer available. I.e., such circuit boards are not suited for ICT-tests.

Most often, for ICT-tests, complicated test instruments with installed signal converters and complicated signal processing are required for registering and calculating the impedances. The calculated actual impedance is compared in a test program with what the impedance should be, and a deviation calculated. If the deviation is too large, the pertinent component is reported as defective.

SUMMARY OF THE INVENTION

An object of the invention is, therefore, to provide a method for detecting component defects of an analog signal processing circuit, especially for a measurement transmitter, not having the above-described disadvantages, and which, especially, can be performed simply and cost-favorably.

This object is achieved by a method which produces a test signal (TS) at a first test point (TP1) of a signal processing circuit (SPC), taps at a signal (SO) of the signal processing circuit (SPC), serving as a second test point (TP2), a response signal (RS) associated with the test signal (TS), evaluates the response signal (RS) in a digital unit, determines an actual amplitude value (AA) of the response signal (AS) at at least two points in time, compares actual amplitude values (AA) of the response signal (RS) with predetermined, desired amplitude values, and in case significant deviations are found in the comparison, issuing a defect report and/or an OK-report in the case of agreement.

An essential idea of the invention is to produce a test signal on a first test point of the signal processing circuit, to then tap such test signal at the signal output of the signal processing circuit and to evaluate the tapped signal in the digital unit of the measurement transmitter.

In this way, no externally accessible test points are needed for the method.

Complex test instruments can likewise be omitted. The evaluation is done in the digital unit, which is present anyway.

The simplicity of the method is distinguished by the fact that the response signal is evaluated only at few, selected points in time. The goal of the method is not to locate defective components on the signal processing circuit exactly; rather, the method should enable a simple decision, whether, in principle, component detects are present. Exact locating can then be done in a subsequent step, or, in mass production, this further step might be omitted, for economic reasons. The defective signal processing circuit is then simply disposed of, as defective.

Advantageously, the test signal is trapezoidally shaped, since, with the defined, rising and falling edges of such a signal, differentiating characteristics of the signal processing circuit can be easily tested. The constant region of the signal permits checking of integrating, or amplifying, circuit parts.

A special example, in the case of which the method of the invention can be easily applied, is a low-pass filter.

The method can also be executed during measurement operation of the sensor. In such case, the portions of the measurement signal are easily taken into consideration during the evaluation.

BRIEF DESCRIPTION OF THE DRAWINGS

The invention will now be explained in greater detail on the basis of an example of an embodiment presented in to drawing, the figures of which show as follows.

DETAILED DISCUSSION

Figure 1:
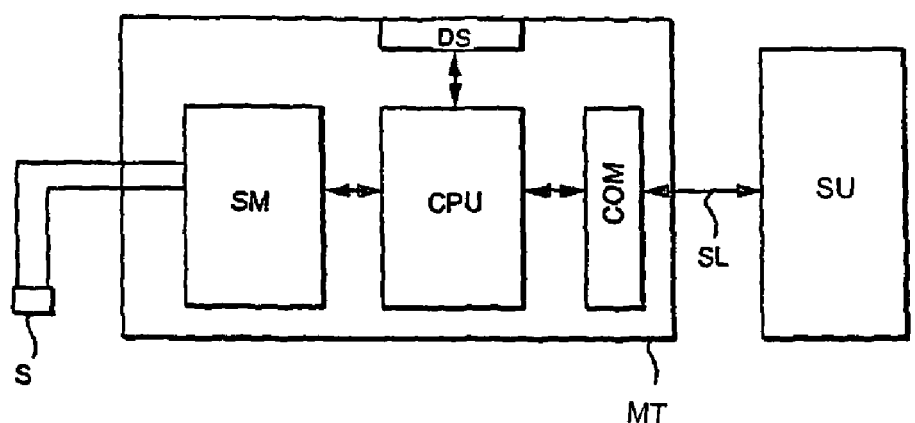
FIG. 1 a block diagram of a measurement transmitter.

FIG. 1 shows a block diagram of a typical measurement transmitter MT for process automation technology. A sensor S, which is connected with a sensor module SM in the measurement transmitter, registers e.g. the temperature of a process medium. Occurring in the sensor module SM are a conditioning of the analog sensor signal, followed by digitizing and evaluation in a microcontroller. The sensor module SM is connected with a processor module CPU. The processor module serves essentially for processing the sensor signal on the basis of other process-relevant parameters, for conditioning for presentation in a display, and for forwarding of the process values.

The processor module CPU is connected with a display/servicing unit DS composed of a display and a keyboard. Additionally, the processor module CPU is connected with a communication module COM, which enables a connecting of the measurement transmitter MT to various communication systems. Examples of such are fieldbusses, such as e.g. Profibus, Foundation Fieldbus, HART, etc.. The corresponding signals are transmitted via a signal line SL. As a rule, measurement transmitters are connected with a superordinated unit SU. The superordinated unit SU can be a controller (PLC) or a control system in a control room.

Figure 2:
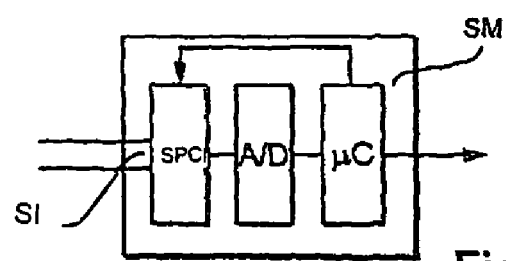
FIG. 2 the essential structure of a sensor module of a measurement transmitter of FIG. 1.

FIG. 2 shows the sensor module SM of the measurement transmitter MT as a block diagram. The sensor module is composed essentially of a signal processing circuit SPC, an analog/digital converter A/D and a microcontroller μC.

The analog measurement signal of the sensor S is fed to the signal processing circuit SPC via a signal input SI.

Figure 3:
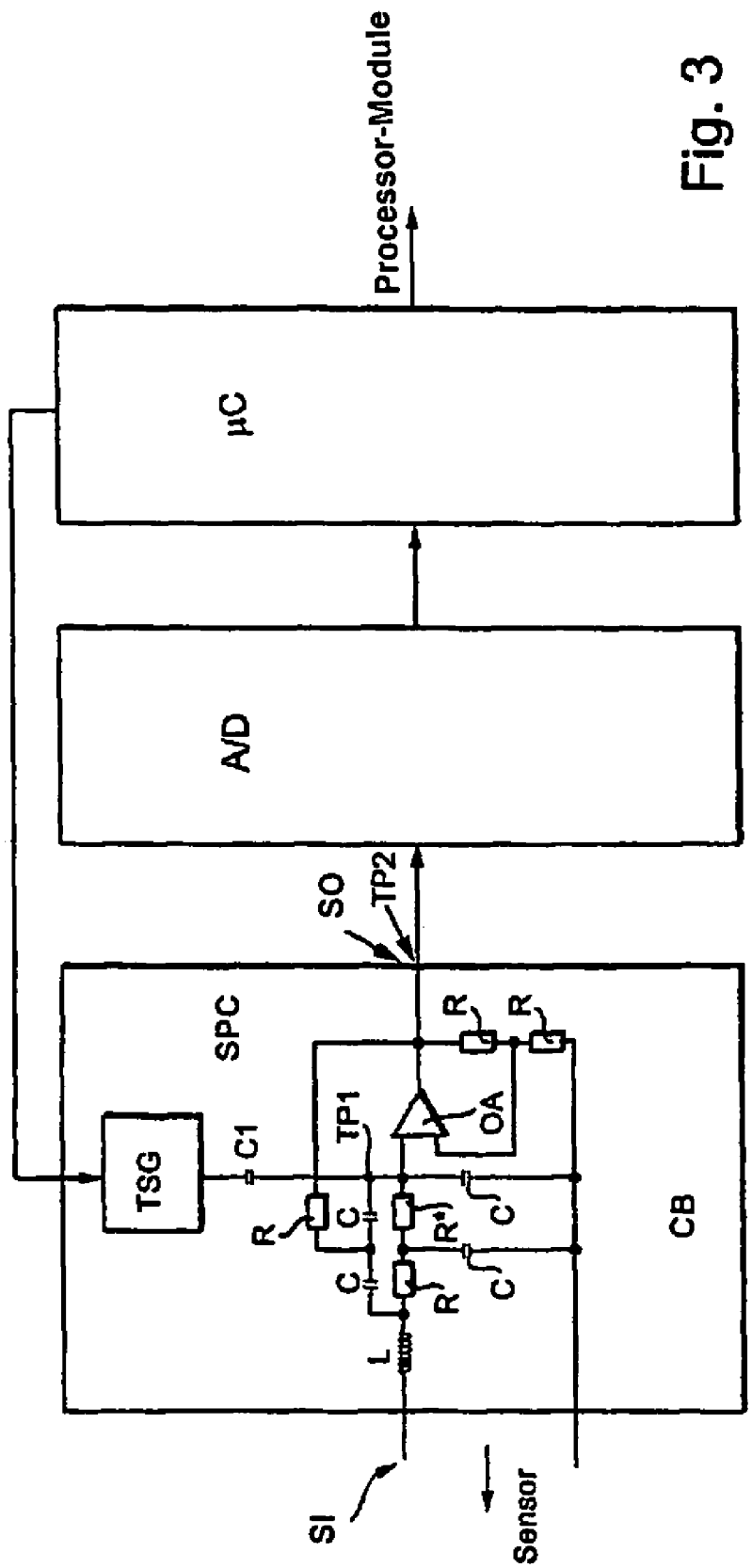
FIG. 3 a detailed drawing of a sensor module of FIG. 2.

The signal processing circuit SPC is shown in more detail in FIG. 3 as part of the sensor module SM. The signal processing circuit SPC includes, as analog components, a plurality of resistors R and capacitors C, a coil L and an operational amplifier OA, which are arranged on a circuit board (which may be a circuit card) CB. Additionally present on the circuit board CB is a test signal generator TSG. The signal processing circuit SPC serves for analog conditioning of the measurement signal MS and is a filtering circuit, the details of which need not be explained here. In measurement transmitters, different signal processing circuits are used, depending on sensor type. The conditioned measurement signal is fed via a signal output SO of the signal processing circuit SPC to an analog/digital converter A/D. Following digitizing of the conditioned measurement signal, the digitized measurement signal is further processed in a microcontroller μC and then sent to the processor module CPU.

Via the test signal generator TSG, which is turned on by the microcontroller μC, a test signal TS can be coupled via a capacitor C1 capacitively to a test point TP1 of the signal processing circuit SPC. The response signal RS associated with the test signal TS is fed via the signal output SO, which serves as second test point TP2, to the A/D converter and subsequently to the microcontroller μC for evaluation.

Figure 5:
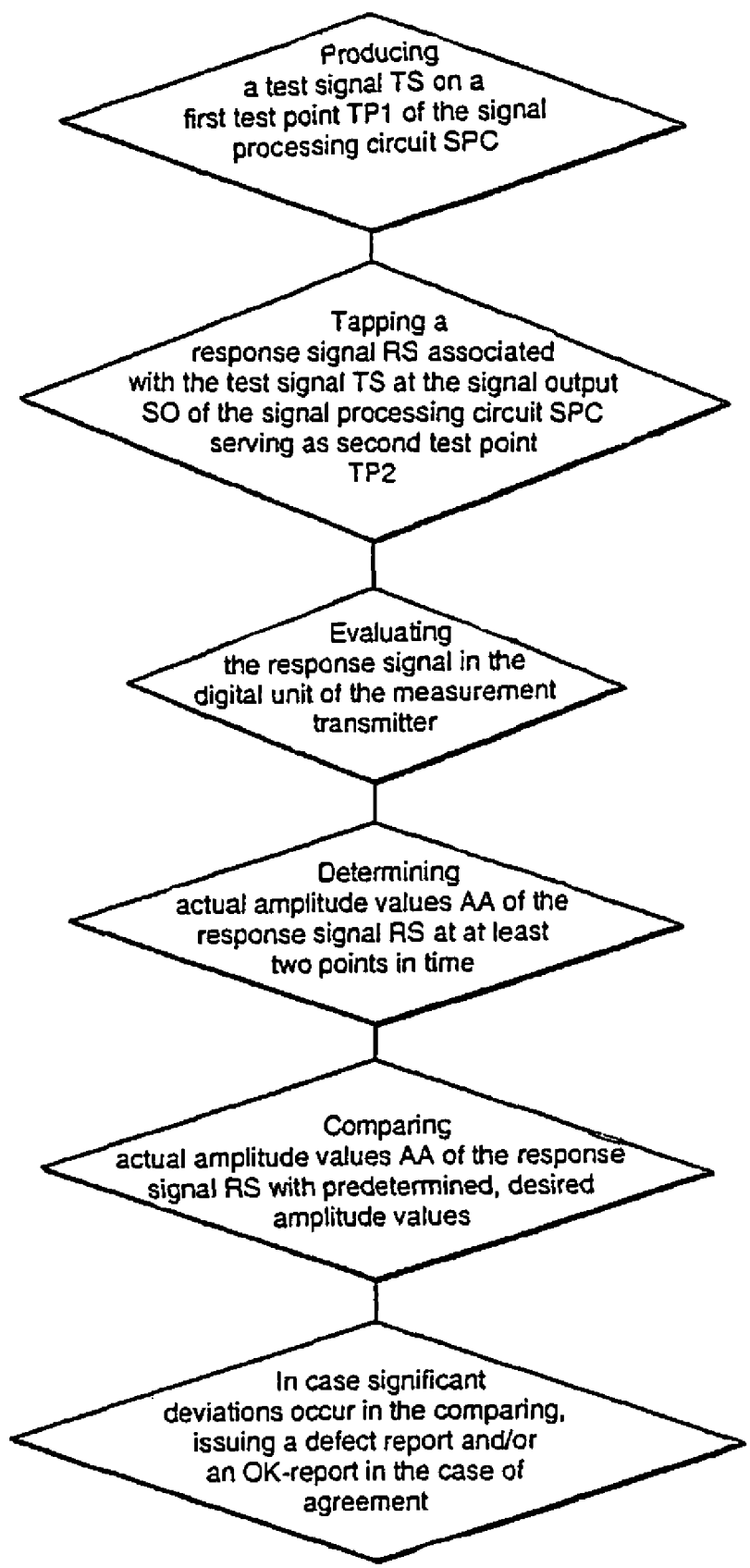
FIG. 5 a flow diagram of individual steps of the method of the invention.

The method of the invention will now be explained in greater detail on the basis of the flow diagram of FIG. 5. At test point TP1, the test signal TS produced in the test signal generator TSG is coupled into the signal processing circuit SPC. As evident from FIG. 3, test point TP1 is not directly connected with the signal input SI. The response signal RS associated with the test signal TS is registered at the signal output SO, the test point TP2.

Response signal RS is evaluated in the microcontroller μC as a digital quantity, following its digitizing in the A/D converter. For the evaluation, the amplitude of the response signal RS is determined at at least two definite points T1 and T2 in time. The actual amplitude values AA1 and AA2 at the points in time T1 and T2 are compared with the desired amplitude values AD1 and AD2 for the corresponding points in time T1, T2. For this, the corresponding, desired values must be stored in the microcontroller μC. If there is a significant deviation, a defect report is generated and/or an OK-report issued, in the case of agreement.

Figure 4:
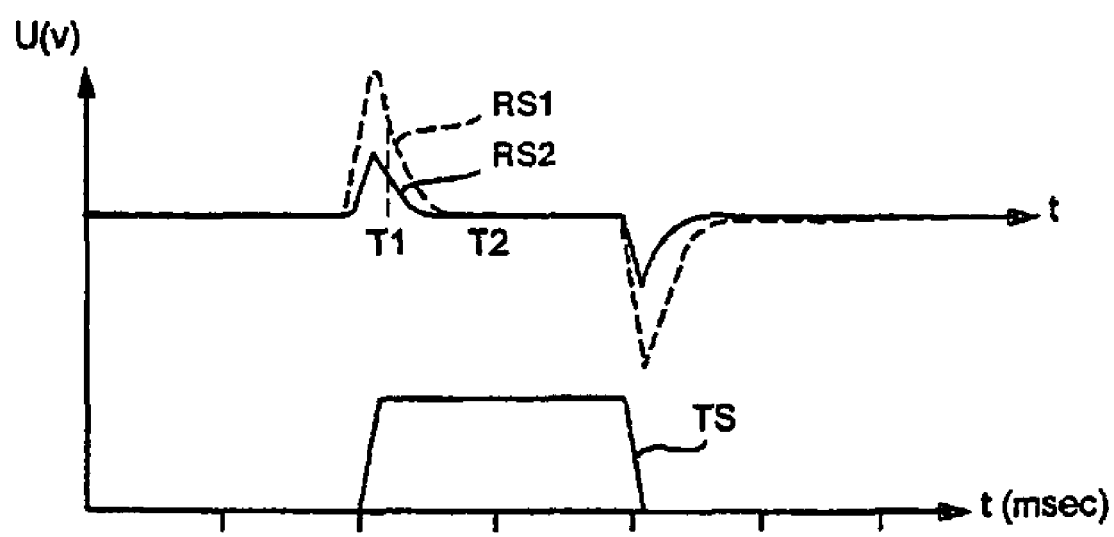
FIG. 4 a test signal and response signal, as functions of time.

FIG. 4 shows, as special test signal, a trapezoidal test signal TS, together with two different response signals RS. Plotted is voltage U as a function of time t. These signals could be recorded with an oscillograph, if the corresponding test points are accessible.

The response signal RS1 shows the response signal to be expected in the case of an intact and correctly populated, signal processing circuit SPC. If e.g. the resistor R indicated with the star is erroneously populated, e.g. 86 kΩ, instead of 680 kΩ, then the response signal RS2 of the dashed line is obtained. The difference in the two signals RS1, RS2 is evident. If the desired amplitude values of the response signal RS are stored in the microcontroller μC, then it can easily be ascertained by comparison of the actual amplitude values AA with the desired amplitude values AD, whether components of the signal processing circuit SPC were defectively populated.

In the case of significant deviations, a corresponding defect report is generated and/or an OK-report, in the case of agreement.

Frequently, already comparison of the amplitude values at two points in time is sufficient. A comparison at more points in time increases the computational burden, but such can result in a greater reliability of the method.

The selection of the test signal TS and the test point TP1 must, in each case, be matched to the signal processing circuit SPC. There are test points where the in-coupling of the test signal TS is more appropriate and points where such is less appropriate.

Of course, the test signal can also be produced and evaluated during operation of the measurement transmitter. To this end, only the appropriate portion of the measurement signal that contains the response signal is taken into consideration, as regards performing the method of the invention.

The invention also includes an electronic assembly containing a device for performing the method.

The invention claimed is:

1. A method for detecting component defects of an analog signal processing circuit, especially for a measurement transmitter serving for signal conditioning of an analog measurement signal, which is fed, following conditioning, to a downstream digital unit for further signal processing, comprising the steps of:
producing a test signal (TS) at a first test point (TP1) of a signal processing circuit (SPC);
tapping at a signal output (SO) of the signal processing circuit (SPC), serving as a second test point (TP2), a response signal (RS) associated with the test signal (TS);
evaluating the response signal (RS) in a digital unit;
determining an actual amplitude value (AA) of the response signal (AS) at at least two points in time;
comparing actual amplitude values (AA) of the response signal (RS) with predetermined, desired amplitude values; and
in case significant deviations are found in the comparison, issuing a defect report and/or an OK-report in the case of agreement.

2. The method as claimed in claim 1, wherein:
the test signal (TS) is trapezoidal.

3. The method as claimed in claim 1, wherein:
the signal processing circuit (SPC) is a low-pass filter.

4. The method as claimed in claim 1, wherein:
the method is performed during operation of the signal processing circuit (SPC).

5. An electronic assembly including a device for performing a method comprising the steps of:

producing a test signal (TS) at a first test point (TP1) of a signal processing circuit (SPC); tapping at a signal output (SO) of the signal processing circuit (SPC), serving as a second test point (TP2), a response signal (RS) associated with the test signal (TS); evaluating the response signal (RS) in a digital unit; determining an actual amplitude value (AA) of the response signal (AS) at at least two points in time; comparing actual amplitude values (AA) of the response signal (RS) with predetermined, desired amplitude values; and in case significant deviations are found in the comparison, issuing a defect report and/or an OK-report in the case of agreement in case of significant deviations, the device comprising:

a measurement transmitter;

a sensor connected to said measurement transmitter; and a superordinated unit connected to said measurement transmitter, wherein:

said measurement transmitter having a sensor module including a signal processing circuit, an analog/digital converter and a microcontroller; and a test signal generator, said test signal generator connected to said microcontroller.

\* \* \* \* \*